(12) United States Patent
Kao et al.

(10) Patent No.: US 9,683,292 B2
(45) Date of Patent: Jun. 20, 2017

(54) METAL CIRCUIT STRUCTURE

(71) Applicant: INDUSTRIAL TECHNOLOGY RESEARCH INSTITUTE, Hsinchu (TW)

(72) Inventors: Tune-Hune Kao, Hsinchu (TW); Meng-Chi Huang, Zhongli (TW); Min-Chieh Chou, Taipei (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 15/290,668

(22) Filed: Oct. 11, 2016

(65) Prior Publication Data

US 2017/0029953 A1  Feb. 2, 2017

Related U.S. Application Data

(62) Division of application No. 14/323,248, filed on Jul. 3, 2014, now Pat. No. 9,499,911.

(30) Foreign Application Priority Data

Nov. 1, 2013 (TW) .............................. 102139840 A

(51) Int. Cl.
*H05K 1/09* (2006.01)
*C23C 18/16* (2006.01)
(Continued)

(52) U.S. Cl.
CPC ............ *C23C 18/1651* (2013.01); *C09D 5/24* (2013.01); *C23C 18/165* (2013.01);
(Continued)

(58) Field of Classification Search
CPC .... H05K 1/092; H05K 1/0296; H05K 1/0373; H05K 3/182; H05K 3/107; H05K 3/185;
(Continued)

(56) References Cited

U.S. PATENT DOCUMENTS 3,836,709 A    9/1974  Hutchison
6,100,007 A    8/2000  Pang et al.
(Continued)

FOREIGN PATENT DOCUMENTS

CN    101640972 A    2/2010
CN    101902884 A    12/2010
(Continued)

OTHER PUBLICATIONS

Sven Passinger et al., "Direct 3D Patterning of $TiO_2$ Using Femtosecond Laser Pulses" Advanced Materials, vol. 19, Issue 9, pp. 1218-1221, Apr. 2007.
(Continued)

*Primary Examiner* — Hoa C Nguyen
(74) *Attorney, Agent, or Firm* — Rabin & Berdo, P.C.

(57) ABSTRACT

A metal circuit structure is provided. The metal circuit structure includes a substrate, a first trigger layer and a first metal circuit layer. The first trigger layer is disposed on the substrate and includes a first metal circuit pattern. The first metal circuit layer is disposed on the first circuit pattern and is electrically insulated from the substrate. The composition of the first trigger layer includes an insulating gel and a plurality of trigger particles. The trigger particles are at least one of organometallic particles, a chelation and a semiconductor material having an energy gap greater than or equal to 3 eV. The trigger particles are disposed in the insulating gel, such that the dielectric constant of the first trigger layer after curing is between 2 and 6.5.

13 Claims, 4 Drawing Sheets

(51) Int. Cl.
*C09D 5/24* (2006.01)
*H05K 3/46* (2006.01)
*H05K 3/10* (2006.01)
*H05K 3/18* (2006.01)
*H05K 1/02* (2006.01)
*H05K 1/03* (2006.01)

(52) U.S. Cl.
CPC ...... *C23C 18/1608* (2013.01); *C23C 18/1612* (2013.01); *H05K 1/0296* (2013.01); *H05K 1/0373* (2013.01); *H05K 3/107* (2013.01); *H05K 3/185* (2013.01); *H05K 3/4661* (2013.01); *H05K 3/4676* (2013.01); *H05K 2201/0209* (2013.01)

(58) Field of Classification Search
CPC ............... H05K 3/4661; H05K 3/4667; H05K 2201/032; C09D 5/24; C23C 18/1651; C23C 18/1608; C23C 18/1612
See application file for complete search history.

(56) References Cited

U.S. PATENT DOCUMENTS

| | | | |
|---|---|---|---|
| 6,833,511 | B2 | 12/2004 | Uchinono et al. |
| 7,105,223 | B2 | 9/2006 | Kliesch et al. |
| 7,815,475 | B2 | 10/2010 | Peloza et al. |
| 7,987,589 | B2 | 8/2011 | Huang et al. |
| 9,074,070 | B2 | 7/2015 | Yung et al. |
| 2001/0046642 | A1 | 11/2001 | Johnson et al. |
| 2004/0241422 | A1 | 12/2004 | Naundorf et al. |
| 2007/0247822 | A1 | 10/2007 | Naundorf |
| 2008/0277805 | A1 | 11/2008 | Kusunoki et al. |
| 2009/0135356 | A1 | 5/2009 | Ando |
| 2011/0155440 | A1* | 6/2011 | Tseng ............ H05K 3/107 174/266 |
| 2012/0183793 | A1 | 7/2012 | John et al. |
| 2012/0279764 | A1 | 11/2012 | Jiang et al. |
| 2012/0329922 | A1 | 12/2012 | Schrauwen |
| 2013/0105972 | A1 | 5/2013 | Tam et al. |
| 2013/0203897 | A1 | 8/2013 | Kornmann et al. |
| 2014/0159285 | A1 | 6/2014 | Choi |
| 2014/0193841 | A1 | 7/2014 | Welch et al. |
| 2014/0220844 | A1 | 8/2014 | Amla et al. |
| 2014/0255600 | A1 | 9/2014 | Bastenbeck et al. |
| 2016/0186327 | A1* | 6/2016 | Yi ............... C23C 18/31 427/556 |

FOREIGN PATENT DOCUMENTS

| | | |
|---|---|---|
| CN | 102066473 A | 5/2011 |
| CN | 103261301 A | 8/2013 |
| EP | 2581469 A1 | 4/2013 |
| EP | 2590217 A2 | 5/2013 |
| JP | 2001313445 A | 11/2001 |
| JP | 4010202 B2 | 11/2007 |
| TW | 192509 | 10/1992 |
| TW | M3733574 U | 2/2010 |
| TW | M421670 U | 1/2012 |
| TW | 201205952 A | 2/2012 |
| TW | M430013 U | 5/2012 |
| TW | M433058 U | 7/2012 |
| TW | M447458 U | 2/2013 |
| TW | M448053 U | 3/2013 |
| TW | 201332405 A | 8/2013 |
| TW | I423750 B | 1/2014 |
| TW | I424875 B | 2/2014 |
| WO | WO-2012-150736 A1 | 11/2012 |

OTHER PUBLICATIONS

Matthieu Bellec et al., "Beat the diffraction limit in 3D direct laser writing in photosensitive glass" Optic Express, vol. 17, Issue 12, pp. 10304-10318, Jun. 2009.

Sean Wong et al., "Direct Laser Writing of Three-Dimensional Photonic Crystals with a Complete Photonic Bandgap in Chalcogenide Glasses" Advanced Materials, vol. 18, Issue 3, pp. 265-269, Feb. 2006.

LaserFocusWorld, "Photonics Applied: Microelectronics processing: Laser direct structuring creates low-cost 3D integrated circuits" vol. 46, Issue 10, Oct. 1, 2010.

Nils Heininger et al., "3D LDS Components for New Production Opportunities" Microwave Journal, Feb. 14, 2012.

Jean Hoffman et al., "Lasing circuits in 3D" Machine Design, May 10, 2007.

Extended European Search Report dated Mar. 25, 2015.
Taiwanese Office Action dated Mar. 17, 2016.
Chinese Office Action dated Apr. 27, 2016.

* cited by examiner

METAL CIRCUIT STRUCTURE

CROSS-REFERENCE TO RELATED APPLICATION

This application is a divisional application of co-pending U.S. application Ser. No. 14/323,248, filed on Jul. 3, 2014, which is allowed for issuance as a patent.

BACKGROUND OF THE INVENTION

1. Field of the Invention

The disclosure relates in general to a metal circuit structure, a method for forming a metal circuit and a liquid trigger material for forming a metal circuit, and more particularly, to a method for forming a metal circuit on a substrate by electroless plating, a liquid trigger material applied for electroless plating and a metal circuit structure formed using the same.

2. Background of the Related Art.

To integrate more functions into a single portable electronic device or to miniaturize the size of a portable electronic device, developers and manufacturers strive to reduce the volume of components inside the device. For example, transceiving antennas previously dominated by printed circuit boards are gradually being replaced by a laser direct structuring (LDS) technology that directly electroplates a conductive material on a device casing.

However, the LDS technology is applicable to only certain plastic substrates, with a limited range of dielectric constants, and thereby is not suitable for high-frequency antennas. Besides, due to injection molding adopted, the LDS technology yields an overall structure that exceeds 2 mm. Further, the thickness of a laser-etched conductive circuit needs at least 10-15 μm, and only a single-layer conductive circuit can be formed.

SUMMARY OF THE INVENTION

The disclosure is directed to a metal circuit structure, a method for forming a metal circuit and a liquid trigger material for forming a metal circuit, which are capable of forming a single-layer or multi-layer metal circuit on different types of substrates.

According to one embodiment, a liquid trigger material that is curable and suitable for forming a metal circuit is provided. The liquid trigger material comprises: an insulating gel comprised of a macromolecular material that is curable; and a plurality of trigger particles comprised of at least one of organometallic particles, a chelation, and a semiconductor material having an energy gap greater than or equal to 3 eV, the trigger particles being activated when irradiated by a laser having a first wavelength; wherein, the trigger particles are distributed in the insulating gel, such that the liquid trigger material has a viscosity of less than 10000 cP The liquid trigger material, after curing, has a dielectric constant between 2 and 6.5.

According to another embodiment, a method for forming a metal circuit is provided. The method includes the steps of providing a substrate; forming a first trigger layer on the substrate by applying then curing the liquid trigger material described above; ablating the first trigger layer using a laser having a first wavelength to form a first circuit pattern, such that the first circuit pattern exposes and activates at least a part of the trigger particles; and depositing a metal material on the first circuit pattern by electroless plating to form a first metal circuit layer.

According to an alternative embodiment, a metal circuit structure is provided. The metal circuit structure includes a substrate; a first trigger layer disposed on the substrate and comprised of a first circuit pattern; and a first metal circuit layer disposed on the first circuit pattern and electrically insulated from the substrate; wherein the first trigger layer has a composition comprised of an insulating gel that is cured; and a plurality of trigger particles comprised of at least one of organometallic particles, a chelation, and a semiconductor material having an energy gap greater than or equal to 3 eV, the plurality of trigger particles being distributed in the insulating gel such that the first trigger layer has a dielectric constant ranging between 2 and 6.5.

Figure 1:
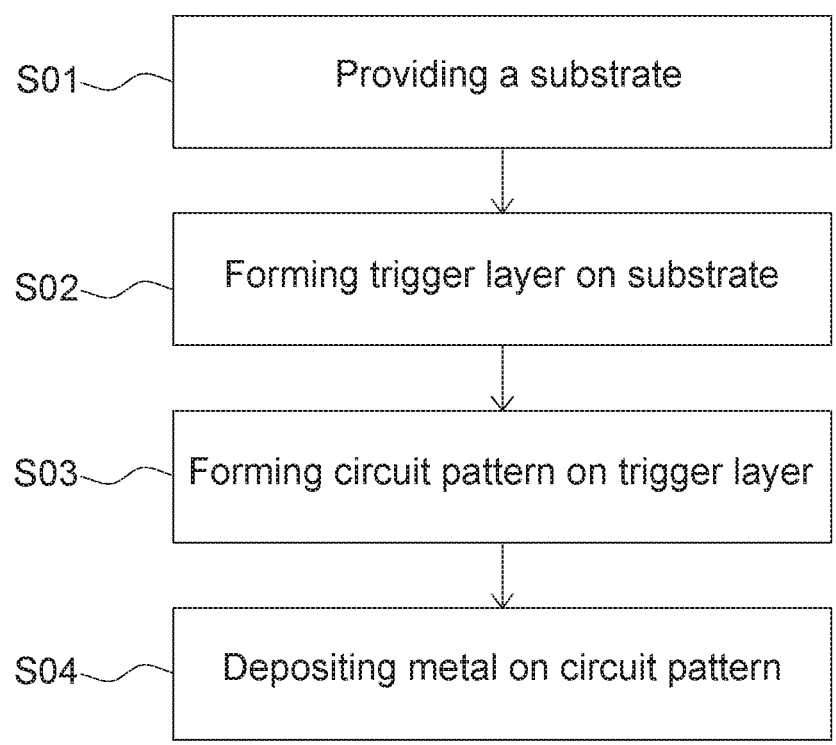
FIG. 1 is a flowchart of a method for forming a metal circuit according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

FIG. 1 shows a flowchart of a method for forming a metal circuit according to an embodiment. As shown in FIG. 1, the method includes steps S01 to S04. In step S01, a substrate is provided. In step S02, a trigger layer is formed on the substrate. In step S03, a circuit pattern is formed on the trigger layer. In step S04, a metal is deposited on the circuit pattern. With the above method, a single-layer or multi-layer metal circuit can be formed on the substrate.

Details of the steps of the method for forming a metal circuit in FIG. 1 are given with reference to FIGS. 2A to 2C below.

Figure 2A:
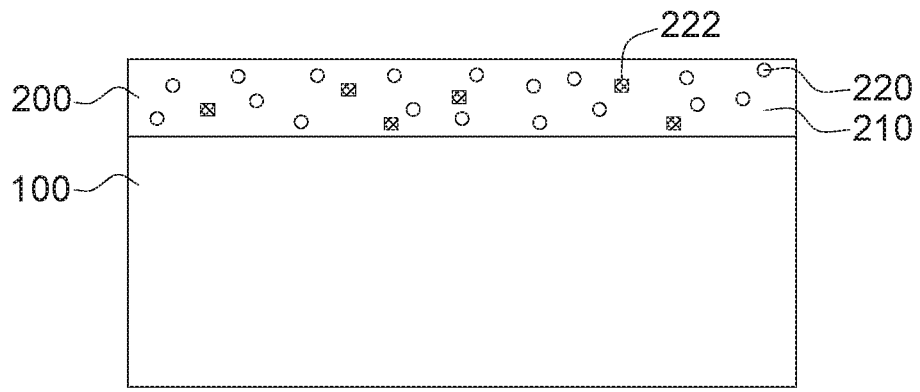
FIGS. 2A to 2C are steps of the method for forming a metal circuit in FIG. 1.
Figure 2B:
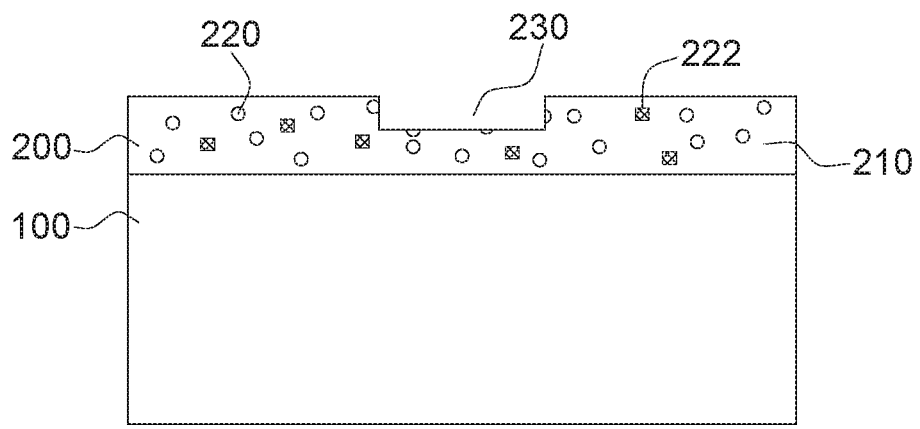

As shown in FIG. 2A, a substrate 100 is provided, and a first trigger layer 200 is formed on the substrate 100. The substrate 100 may be made of a conductive material or a non-conductive material. In the embodiment, the substrate 100 has a flat surface. In practice, the first trigger layer 200 may be formed on a substrate 100 having any shape to form a stereoscopic metal circuit structure. The first trigger layer 200 is formed by heating and curing a trigger material. The trigger material includes an insulating gel 210, and a plurality of trigger particles 220 distributed in the insulating gel 210. The insulating gel 210 is a macromolecular material, e.g., epoxy, polyurethane (PU) or cyclic olefin copolymer/polymer (COC/COP), and requires a curing temperature that is lower than a heat-resistant temperature or a glass transition temperature $T_g$ of the substrate 100. In one embodiment, to perform a subsequent electroless plating process (to be described later), the glass transition temperatures $T_g$ of the substrate 100 and the insulating gel 210 are both greater than 60° C. In one embodiment, when the viscosity of the liquid trigger material mixed with the trigger particles 220 is lower than 10000 centipoise (cP), the cured first trigger layer 200 is smooth and uniform. The trigger particles 220 are active particles having a high dielectric constant, such as organometallic particles, a chelation, a semiconductor material having an energy gap greater than or equal to 3 eV, or combinations thereof. In one embodiment, the trigger material after curing has a dielectric constant between 2 and 6.5. The trigger material may further include a pigment 222. The pigment 222 may be a common pigment, and includes either an inorganic pigment or an organic pigment. For example, the inorganic pigment may be titanium dioxide (white) or carbon black (black); and the organic pigment may be an azo pigment (—N═N—), copper phthalocyanine blue ($C_{32}H_{16}N_8Cu$) or phthalocyanine green ($C_{32}HCl_{15}N_8Cu$). The addition of the pigment 222, as an optional element, increases the laser absorption rate of the macromolecular material so that a subsequent laser ablation step (to be described later) can be facilitated. The liquid trigger material according to the embodiment is complete after evenly distributing the pigment 222 and the trigger particles 220 in the insulating gel 210. The trigger material is sprayed, screen printed or applied to cover a predetermined position for forming the metal circuit layer on the substrate 100. Once the trigger material is heated and becomes cured, the first trigger layer 200 is formed. In one embodiment, the trigger particles 220 constitute approximately 0.1 to 30 weight percent of the trigger material, and the pigment 222 constitutes approximately 3 to 30 weight percent of the trigger material.

As previously stated, the trigger particles 220 may be organometallic particles. An organometal is a compound containing bonds between a metal and carbon. The structure of an organometal is represented as R-M-R' or R-M-X, where M is a metal, e.g., gold, silver, copper, tin, aluminum, nickel, palladium or combinations thereof, R and R' are organic functional groups including an alkyl group, aromatic hydrocarbons group, cycloalkyl group, alkyl halide, heterocycle group or carboxylic acid, and X is a halogen compound or an amine group. In one embodiment, the organic particles may be lithium 2-thienylcyanocuprate ($C_5H_3CuLiNS$), phenylmagnesium chloride, ($C_6H_5ClMg$), 4-(tributylstannyl)pyridine ($C_{17}H_{31}NSn$), ethylaluminum dichloride ($C_2H_5AlCl_2$) or combinations thereof. It should be noted that, in the structure R-M-R' of an organometal, the metal M may be bonded with two or more organic functional groups R or R'. For example, in one embodiment, the metal M may be bonded with four or six organic functional groups R or R'. Further, the multiple organic functional groups R or R' bonded with the metal M may be the same or different.

The trigger particles 220 may also be a chelation formed from a metal chelated by a chelating agent. For example, trigger particles 220 may be formed by ammonium pyrrolidine dithiocarbamate (APDC) that chelates copper, iron, nickel, zinc or combinations thereof, or a chelating agent such as ethylenediaminetetraacetic acid (EDTA), N-N'-bis(carboxymethyl) nitrotriacetate or diethylenetriamine pentaacetic acid (DTPA) that chelates gold, silver, copper, tin, aluminum, nickel, palladium or combinations thereof. The types of chelates and metals adopted are not limited by the disclosure.

The trigger particles 220 may be a semiconductor material having an energy gap greater than or equal to 3 eV. Semiconductor materials having an energy gap greater than or equal to 3 eV include gallium nitride (GaN), zinc sulfide (ZnS), silicon carbide (SiC), zinc oxide (ZnO), titanium dioxide ($TiO_2$) and aluminum gallium nitride (AlGaN). Semiconductor materials having an energy gap greater than or equal to 4 eV include aluminum nitride (AlN), aluminum oxide ($Al_2O_3$), boron nitride (BN), silicon nitride ($Si_3N_4$) and silicon dioxide ($SiO_2$). The trigger particles 220 may be at least one material selected from the group consisting of the above semiconductor materials.

It should be noted that, when metal ions are surrounded by an organic functional group R or a chelating agent, electrons are prohibited from free movements. That is to say, the three types of trigger particles 220 above are non-conductive before the subsequent laser ablation step is performed, and have a higher dielectric constant. Thus, the first trigger layer 200 formed from a cured mixture of the trigger particles 220 and the insulating gel 210 also has a higher dielectric constant. In one embodiment, the dielectric constant of the first trigger layer 200 is between 2 and 6.5. Compared to the conventional LDS technology that adopts metal particles as trigger particles for the subsequent electroless plating process, the first trigger layer 200 of the embodiment has excellent insulating properties and is thus less prone to electricity leakage. As having a higher dielectric constant, the metal circuit formed according to the embodiment, without causing signal interference, may be applied to a high-frequency circuit of a radio circuit,.

Since the first trigger layer 200 is formed by curing the liquid trigger material, the thickness and position of formation of the first trigger layer 200 may be adjusted as desired. Instead of covering as a complete layer on the substrate 100 as shown in FIG. 2A, the liquid trigger material may be sprayed or applied to a predetermined region on the substrate 100 to keep the trigger particles 220 concentrated and to reduce the amount of material used. In one embodiment, the thickness of the first trigger layer 200 is between 10 and 100 μm. In contrast, as the LDS technology involves dual materials of a catalyst and plastic particles for injection molding, a colossal amount of catalyst is required for a large-size application, and the catalyst is liable to be unevenly distributed such that the metal circuit cannot be readily formed. Further, the injection equipment utilized in the LDS technology has a limitation of approximately 200 μm, so that the result yielded by the LDS technology is far larger than the range achieved by this embodiment.

Again referring to FIG. 2B, after forming the first trigger layer 200 on the substrate 100, the first trigger layer 200 is ablated by a laser having a first wavelength to form a first circuit pattern 230 according to a metal circuit layer to be formed, such that the first circuit pattern 230 exposes and activates a part of the trigger particles 220. In one embodiment, for example, the laser may be implemented by a high-energy laser (e.g., a YAG laser). The depth, line width and size of the first circuit pattern 230 may be altered based on product requirements by merely changing the energy and irradiation time of the laser. It should be noted that, the first circuit pattern 230 needs to expose and reveal the trigger particles 220 in the trigger layer 200 in order to deposit a metal material in a subsequent process.

The weight percentage of the trigger particles 220 in the first trigger layer 200 may be adjusted as desired. When the weight percentage of the trigger particles 220 to the trigger material is high, a first circuit pattern 230 having a shallow and narrow formation is sufficient for revealing and exposing the trigger particles 220. In contrast, when the weight percentage of the trigger particles 220 to the trigger material is low, the first circuit patter 230 is required to have a deeper and wider formation in order to reveal and expose the trigger particles 220. In one embodiment, when the weight percentage of the trigger particles 220 to the trigger material is 1 to 2 weight percent, the first circuit pattern 230 may be have a line width smaller than or equal to 30 μm and a depth of 5 to 15 μm, so that a first metal circuit layer 300 can be provided with the same line width and depth in a subsequent process. Compared to the conventional LDS technology in which the line width of a metal circuit is 80 to 100 μm, the line width provided by the embodiment is noticeably reduced (30%).

Figure 2C:
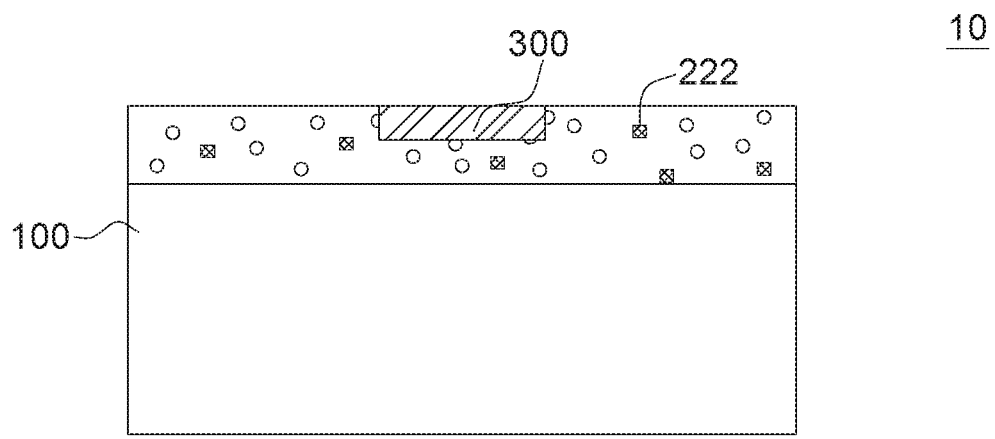

As shown in FIG. 2C, a metal material is deposited on the first circuit pattern 230 to form the first metal circuit layer 300, thus successfully forming a metal circuit on the substrate 100. The metal material can be deposited by electroless plating. The structure shown in FIG. 2B is placed in an electrolyte, and an oxidation reduction reaction happens between to-be-plated metal ions in the electrolyte and the trigger particles 220 exposed on the first circuit pattern 230, such that the to-be-plated metal ions are reduced to a metal and deposited on the first circuit pattern 230. When the trigger particles 220 are an organometal or a chelation, the laser severs the covalent bond R-M between the organic functional group and the metal to expose a part of the metal. When the trigger particles 220 are a semiconductor material having an energy gap of greater than or equal to 3 eV, the laser energy excites the covalent electrons in the semiconductor material, generates electron hole, so that the semiconductor material can be spontaneously reduced. Therefore, only the trigger particles 220 at the part (i.e., the first circuit pattern 230) on the first trigger layer 200 irradiated by the laser are activated to deposit the metal material thereupon. The first wavelength of the laser may be adjusted according to the trigger particles 220 selected, e.g., between 400 to 1200 nm.

Thus, referring to FIG. 2C showing the metal circuit structure formed by the above method, a metal circuit structure 10 includes the substrate 100, the first trigger layer 200 and the first metal circuit layer 300. The first trigger layer 200 is disposed on the substrate 100 and includes the first circuit pattern 230. The first metal circuit layer 300 is disposed on the first circuit pattern 230, and is electrically insulated from the first metal circuit layer 230 and the substrate 100. Further, the composition of the first trigger layer 200 formed by the cured liquid trigger material is the same as that of the trigger material, and so associated details shall be omitted herein.

It should be noted that, the metal circuit structure 10 shown in FIG. 2C has one single metal circuit layer 300, but is not limited thereto. The method for forming a metal circuit according to one embodiment may form a metal circuit structure having multiple metal circuit layers. For example, a metal circuit structure 20 shown in FIG. 3 includes two metal circuit layers, which are a first metal circuit layer 300 and a second metal circuit layer 300'. A structural difference of the metal circuit structure 20 from the metal circuit structure 10 in FIG. 2C is that, the metal circuit structure 20 further includes a second trigger layer 200' for the second metal circuit layer 300'. The second trigger layer 200' includes a second circuit pattern (not shown), and covers the first trigger layer 200 and the first metal circuit layer 300; the second metal circuit layer 300' is disposed on the second circuit pattern.

Figure 3:
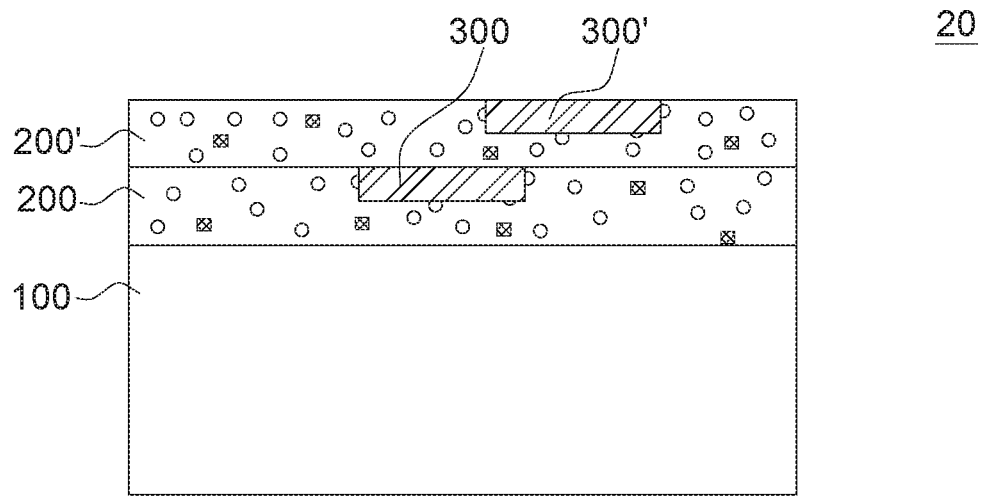
FIG. 3 is a metal circuit structure according to an embodiment.

After completing the single-layer metal circuit structure 10 in FIG. 2C, the method for forming the metal circuit structure 20 in FIG. 3 iterates steps S02 to S04. In step S02 to S04, the second trigger layer 200' is formed to cover the first trigger layer 200 and the first metal circuit layer 300, the second circuit pattern is formed on the second trigger layer 200' by the laser having the first wavelength, and the metal material is deposited on the second circuit pattern by electroless plating to form the second metal circuit layer 300'. The second trigger layer 200' may be formed by the same trigger material as the first trigger layer 200. Similarly, by repeating steps S02 to S04, multiple metal circuit layers can be formed on the substrate 100, so as to form a multi-layer metal circuit structure including multiple metal circuit layers. Compared to the conventional LDS technology which is incapable of manufacturing multi-layer circuits, the method of this embodiment is capable of forming more complex circuits applicable to diversified fields.

Figure 4:
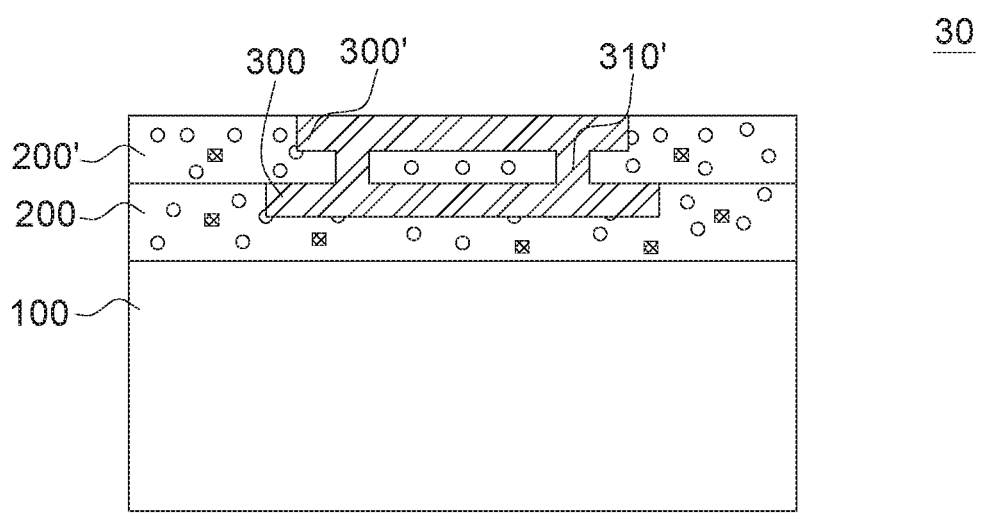
FIG. 4 is a metal circuit structure according to another embodiment.

The cured first trigger layer 200 and second trigger layer 200' are insulating bodies. Thus, by controlling the depth of the second metal circuit layer 300' in the second trigger layer 200', the second metal circuit layer 300' and the first metal circuit layer 300 can be prevented from coming into contact and from shortening. Conversely, to electrically connect the first metal circuit layer 300 and the second metal circuit layer 300', the maximum depth of the second circuit pattern is designed to be the same as the thickness of the second trigger layer 200 when ablating the second trigger layer 200' by the laser, i.e., the second trigger layer 200' is penetrated through by the ablation. As such, an inter-layer connector 310' can be formed at the same time when depositing the second metal circuit layer 300', such that the first metal circuit layer 300 and the second metal circuit layer 300' can be electrically connected, as a metal circuit structure 30 shown in FIG. 4.

Figure 5A:
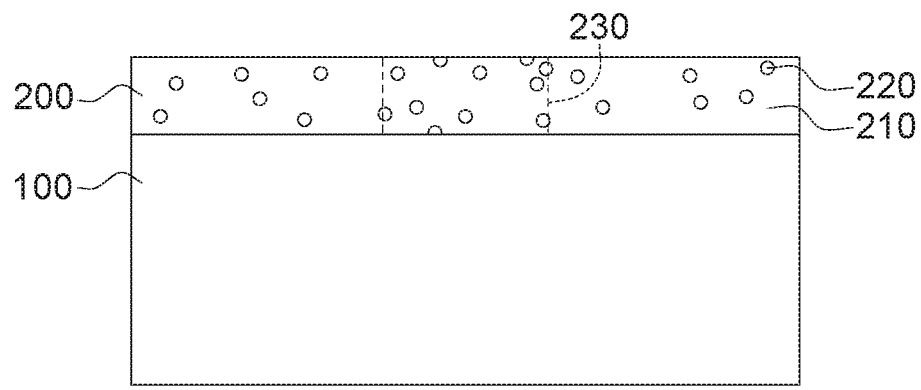
FIGS. 5A to 5C are steps of a method for forming a metal circuit according to another embodiment.
Figure 5B:
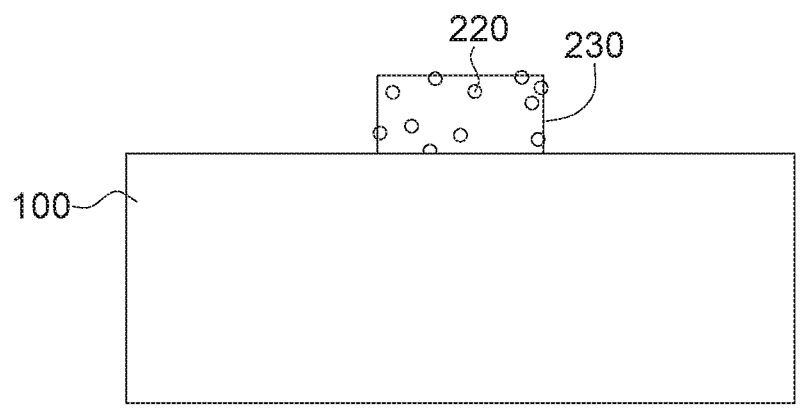
Figure 5C:
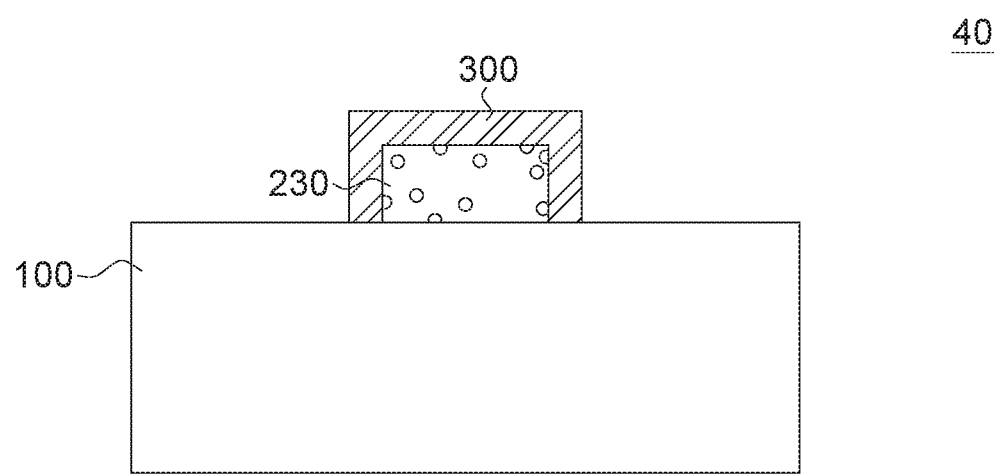

FIGS. 5A to 5C show detailed steps of a method for forming a metal circuit according to another embodiment. The steps in FIGS. 5A to 5C differ from those in FIGS. 2A to 2C in that a trigger material having a different composition is utilized in the method in FIGS. 5A to 5C. Corresponding details are the same, and shall be omitted herein.

As shown in FIG. 5A, a substrate 100 is provided, and a first trigger layer 200 is formed on the substrate 100. The first trigger layer 200 is also formed by heating and curing a trigger material, which is made by uniformly mixing insulating gel 210, trigger particles 220 and a photo-initiator (not shown). For example, the photo-initiator may be a negative photoresist, e.g., 2-benzyl-2-dimethylamino-1-(4-morpholinophenyl)-1-butanone, 4-acetamidobenzenesulfonyl chloride, or dimethoxy-2-phenylacetophenon (DMPEP). The negative photoresist generates bonds when irradiated by beams having a predetermined wavelength, resulting in a reinforced structure. In one embodiment, for example, the photo-initiator constitutes 0.1 to 10 weight percent of the trigger material. The trigger material is sprayed, screen printed or applied onto the substrate 100, and forms the first trigger layer 200 after curing. After forming the first trigger layer 200, a predetermined position of the first circuit pattern 230 is irradiated by a laser having a predetermined wavelength to cure a part of the photo-initiator of the circuit pattern 230 and to activate a part of the trigger particles 220 at the first circuit pattern 230. Based on different selections of photo-initiators and trigger particles 220, a laser having the same wavelength may be utilized to simultaneously cure the photo-initiator and activate the trigger particles 220. Alternatively, the photo-initiator and the trigger particles 220 may be irradiated twice, with a laser having a second wavelength for curing the photo-initiator and a laser having a first wavelength for activating the trigger particles 220. That is to say, the second wavelength for curing the photo-initiator and the first wavelength for activating the trigger particles 220 may be the same or different. For example, the second wavelength for curing the photo-initiator may range between 300 to 500 nm.

As shown in FIG. 5B, the first trigger layer 200 outside the predetermined position of the first circuit pattern 230 is removed. For example, the first trigger layer 200 is immerged in a developing agent. As the photo-initiator is a negative photoresist, the part that is not irradiated is dissolved by the developing agent, and the irradiated part is reinforced instead of being removed by the developing agent to leave the first circuit pattern 230.

As shown in FIG. 5C, a metal material is deposited on the first circuit pattern 230 by electroless plating to generate the first metal circuit layer 300, thus successfully forming a metal circuit on the substrate 100. Such a method is capable of forming a metal circuit on a transparent substrate.

In the method for forming a metal circuit disclosed by the above embodiment, a trigger layer is formed on a substrate by utilizing a specific trigger material, and a metal material is deposited on the trigger layer to form a metal circuit structure. The metal circuit structure formed by the method according to the embodiment, compared to the conventional LDS technology, has a higher dielectric constant, a smaller thickness and a narrower line width, and can be applied to different substrates to form a metal circuit structure having more than one layer.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A metal circuit structure, comprising:
   a substrate;
   a first trigger layer disposed on the substrate and comprised of a first circuit pattern; and
   a first metal circuit layer disposed on the first circuit pattern and electrically insulated from the substrate;
   wherein the first trigger layer has a composition comprised of an insulating gel that is cured; and a plurality of trigger particles comprised of at least one of organometallic particles, a chelation, and a semiconductor material having an energy gap greater than or equal to 3 eV, the plurality of trigger particles being distributed in the insulating gel such that the first trigger layer has a dielectric constant ranging between 2 and 6.5.

2. The metal circuit structure according to claim 1, further comprising:
   a second trigger layer including a second circuit pattern and covering the first trigger layer and the first metal circuit layer; and
   a second metal circuit layer disposed on the second circuit pattern;
   wherein, the second trigger layer is made of a material that is the same as that of the first trigger layer.

3. The metal circuit structure according to claim 2, wherein the second trigger layer has a thickness, and wherein the second circuit pattern has a maximum depth that is the same as the thickness of the second trigger layer, such that an interlayer connector is formed between the first trigger layer and the second trigger layer.

4. The metal circuit structure according to claim 1, wherein the first trigger layer has a thickness ranging between 10 and 100 μm.

5. The metal circuit structure according to claim 1, wherein the first metal circuit layer has a line width that is smaller than or equal to 30 μm.

6. The metal circuit structure according to claim 1, wherein, when the trigger particles are said semiconductor having the energy gap greater than or equal to 3 eV, the trigger particles are gallium nitride (GaN), zinc sulfide (ZnS), silicon carbide (SiC), zinc oxide (ZnO), titanium dioxide ($TiO_2$), aluminum gallium nitride (AlGaN), aluminum nitride (AlN), aluminum oxide ($Al_2O_3$), boron nitride (BN), silicon nitride ($Si_3N_4$), silicon dioxide ($SiO_2$) or combinations thereof.

7. The metal circuit structure according to claim 1, wherein, when the trigger particles are said organometallic particles, the trigger particles have a structure that is R-M-R' or R-M-X, where M is a metal, R and R' are an alkyl group, an aromatic hydrocarbon group, a cycloalkyl group, an alkyl halide group, a heterocycle group or a carboxylic acid group, and X is a halogen compound or amine group.

8. The metal circuit structure according to claim 7, wherein M is gold, silver, copper, tin, aluminum, nickel, palladium or combinations thereof.

9. The metal circuit structure according to claim 1, wherein, when the trigger particles are the chelation, the trigger particles are formed from a metal chelated by a chelating agent, and the chelating agent is ammonium pyrrolidine dithiocarbamate (APDC), ethylenediaminetetraacetic acid (EDTA), N-N'-bis (carboxymethyl) nitrotriacetate, diethylenetriamine pentaacetic acid (DTPA) or combinations thereof.

10. The metal circuit structure according to claim 9, wherein the metal is gold, silver, copper, tin, aluminum, nickel, palladium or combinations thereof.

11. The metal circuit structure according to claim 1, wherein the trigger particles constitute 0.1 to 30 weight percent of the first trigger layer.

12. The metal circuit structure according to claim 1, wherein the first trigger layer further comprises a photo-initiator that is mixed into the insulating gel and constitutes 0.1 to 10 weight percent of the trigger material.

13. The metal circuit structure according to claim 1, wherein the first trigger layer further comprises a pigment that is distributed in the insulating gel and constitutes 3 to 30 weight percent of the trigger material.

* * * * *